(12) United States Patent
Karasawa et al.

(10) Patent No.: US 6,720,628 B2
(45) Date of Patent: *Apr. 13, 2004

(54) SEMICONDUCTOR DEVICE, MEMORY SYSTEM AND ELECTRONIC APPARATUS

(75) Inventors: Junichi Karasawa, Tatsuno-machi (JP); Kunio Watanabe, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/072,855

(22) Filed: Feb. 6, 2002

(65) Prior Publication Data

US 2002/0135027 A1 Sep. 26, 2002

(30) Foreign Application Priority Data

Mar. 26, 2001 (JP) .......................... 2001-088309
Oct. 29, 2001 (JP) .......................... 2001-330784

(51) Int. Cl.$^7$ .............................................. H01L 29/76
(52) U.S. Cl. ...................... 257/377; 257/377; 257/393
(58) Field of Search ................... 257/377, 369, 257/393, 903, 69, 66; 438/238; 365/154

(56) References Cited

U.S. PATENT DOCUMENTS

| 5,734,187 A | 3/1998 | Bohr et al. | |
|---|---|---|---|
| 5,994,719 A | * 11/1999 | Kuriyama et al. | 257/69 |
| 6,090,654 A | * 7/2000 | Kim | 438/238 |
| 6,091,630 A | 7/2000 | Chan et al. | 365/156 |
| 6,285,088 B1 | 9/2001 | Madan | 257/903 |
| 6,404,023 B1 | 6/2002 | Mori et al. | 257/393 |
| 6,469,356 B2 | * 10/2002 | Kumagai et al. | 257/369 |
| 6,479,905 B1 | 11/2002 | Song | 257/903 |
| 2002/0096734 A1 | 7/2002 | Natsume | 257/903 |

FOREIGN PATENT DOCUMENTS

| JP | 03-040449 | 2/1991 |
|---|---|---|
| JP | 07-231044 | 8/1995 |
| JP | 09-260510 | 10/1997 |
| JP | 10-41409 | 2/1998 |
| JP | 10-163344 | 6/1998 |
| JP | 10-294367 | 11/1998 |
| JP | 11-017028 | 1/1999 |
| JP | 2000-036542 | 2/2000 |
| JP | 2000-208643 | 7/2000 |
| JP | 2000-269319 | 9/2000 |

OTHER PUBLICATIONS

U.S. Patent Application No. 10/072,618 filed Feb. 7, 2002.
U.S. Patent Application No. 10/072,316 filed Feb. 8, 2002.

* cited by examiner

Primary Examiner—David Nelms
Assistant Examiner—Thinh T Nguyen
(74) Attorney, Agent, or Firm—Hogan & Hartson, LLP

(57) ABSTRACT

A semiconductor device is provided with a memory cell. The semiconductor device includes a first gate—gate electrode layer, a second gate—gate electrode layer, a first drain—drain wiring layer, a second drain—drain wiring layer, a first drain-gate wiring layer and second drain-gate wiring layers. The first drain-gate wiring layer and an upper layer and a lower layer of the second drain-gate wiring layer are located in different layers, respectively. The width of the first gate—gate electrode layer in the first load transistor is larger than the width of the first gate—gate electrode layer in the first driver transistor.

15 Claims, 16 Drawing Sheets

SEMICONDUCTOR DEVICE, MEMORY SYSTEM AND ELECTRONIC APPARATUS

Japanese Patent Application No. 2001-88309, filed on Mar. 26, 2001, and Japanese Patent Application No. 2001-330784, filed on Oct. 29, 2001 are hereby incorporated by reference in their entirety.

BACKGROUND OF THE INVENTION

The present invention relates to semiconductor devices, such as, for example, static random access memories (SRAMs), and memory systems and electronic apparatuses provided with the same.

SRAMs, one type of semiconductor memory devices, do not require a refreshing operation and therefore have a property that can simplify the system and lower power consumption. For this reason, the SRAMs are prevailingly used as memories for electronic equipment, such as, for example, mobile phones.

BRIEF SUMMARY OF THE INVENTION

The present invention may provide a semiconductor device that can reduce its cell area.

The present invention may further provide a memory system and an electronic apparatus that includes a semiconductor device in accordance with the present invention.

1. Semiconductor Device

A semiconductor device according to a first aspect of the present invention includes a first gate—gate electrode layer including a gate electrode of a first load transistor and a gate electrode of a first driver transistor and a second gate—gate electrode layer including a gate electrode of a second load transistor and a gate electrode of a second driver transistor. The semiconductor device also includes a first drain—drain wiring layer which forms a part of a connection layer that electrically connects a drain region of the first load transistor and a drain region of the first driver transistor and a second drain—drain wiring layer which forms a part of a connection layer that electrically connects a drain region of the second load transistor and a drain region of the second driver transistor. The semiconductor device further includes a first drain-gate wiring layer which forms a part of a connection layer that electrically connects the first gate—gate electrode layer and the second drain—drain wiring layer and a second drain-gate wiring layer which forms a part of a connection layer that electrically connects the second gate—gate electrode layer and the first drain—drain wiring layer, wherein the first drain-gate wiring layer and the second drain-gate wiring layer are located in different layers, respectively, and wherein a width of the first gate—gate electrode layer in the first load transistor is larger than the width of the first gate—gate electrode layer in the first driver transistor.

2. Memory System

A memory system in accordance with a second aspect of the present invention is provided with the semiconductor device of the first aspect of the present invention.

3. Electronic Apparatus

An electronic apparatus in accordance with a third aspect of the present invention is provided with the semiconductor device of the first aspect of the present invention.

DETAILED DESCRIPTION OF THE EMBODIMENT

Figure 1:
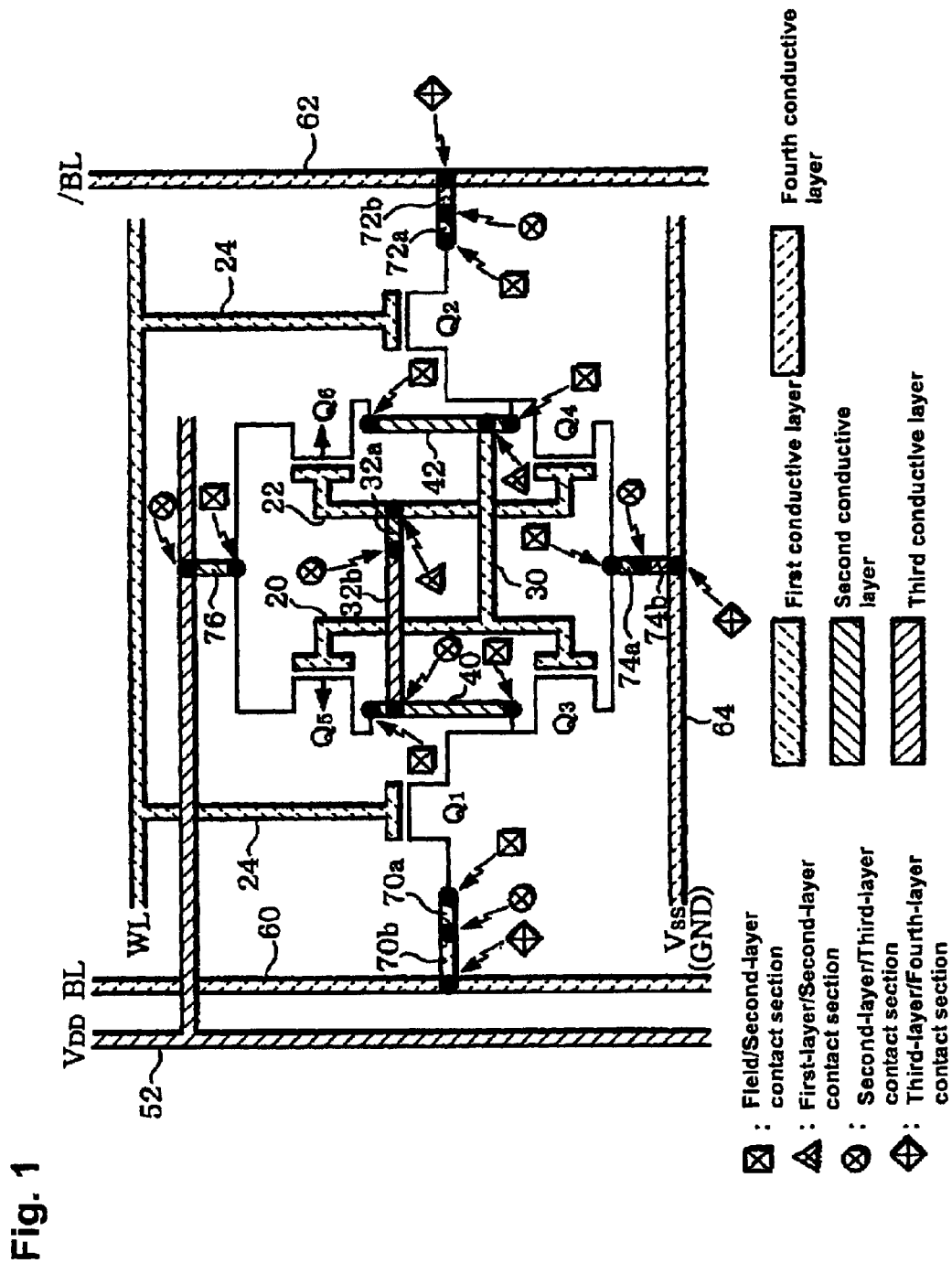
FIG. 1 shows a relationship between an equivalent circuit of an SRAM in accordance with the present embodiment and corresponding conductive layers.

An embodiment of the present invention is described. The present embodiment is the one in which a semiconductor device in accordance with the present invention is applied to in an SRAM.

1. Equivalent Circuit of SRAM

A semiconductor device according to a first aspect of the present invention includes a first gate—gate electrode layer including a gate electrode of a first load transistor and a gate electrode of a first driver transistor and a second gate—gate electrode layer including a gate electrode of a second load transistor and a gate electrode of a second driver transistor. The semiconductor device also includes a first drain—drain wiring layer which forms a part of a connection layer that electrically connects a drain region of the first load transistor and a drain region of the first driver transistor and a second drain—drain wiring layer which forms a part of a connection layer that electrically connects a drain region of the second load transistor and a drain region of the second driver transistor. The semiconductor device further includes a first drain-gate wiring layer which forms a part of a connection layer that electrically connects the first gate—gate electrode layer and the second drain—drain wiring layer and a second drain-gate wiring layer which forms a part of a connection layer that electrically connects the second gate—gate electrode layer and the first drain—drain wiring layer, wherein the first drain-gate wiring layer and the second drain-gate wiring layer are located in different layers, respectively, and wherein a width of the first gate—gate electrode layer in the first load transistor is larger than the width of the first gate—gate electrode layer in the first driver transistor.

The "wiring layer" means a conductive layer disposed over a field or an interlayer dielectric layer.

In accordance with this aspect of the present invention, the second drain-gate wiring layer is located in a layer over the first drain-gate wiring layer. In other words, the first drain-gate wiring layer and the second drain-gate wiring layer are located in different layers, respectively. As a result, the pattern density of a wiring layer in each of the layers where the first drain-gate wiring layer and the second drain-gate wiring layer are formed, respectively, can be reduced and the cell area may be smaller compared to the case where the first drain-gate wiring layer and the second drain-gate wiring layer are formed in the same layer.

The width of the first gate—gate electrode layer in the first load transistor is larger than the width of the first gate—gate electrode layer in the first driver transistor. As a result, for the reasons described below, leak current in the first load transistor can be decreased.

The semiconductor device of this aspect may take at least any one of the following features.

(a) A width of the second gate—gate electrode layer in the second load transistor may be larger than the width of the second gate—gate electrode layer in the second driver transistor. In this feature, leak current in the second load transistor can be decreased for the reasons described below.

(b) The semiconductor device may comprise a first adjacent memory cell which is located adjacent to a side of the memory cell where the first gate—gate electrode layer is provided, the first adjacent memory cell may include a third gate—gate electrode layer having a gate electrode of a third load transistor and a gate electrode of a third driver transistor, the first load transistor and the third load transistor commonly may use a first impurity layer as a source region, a first contact section may be provided on the first impurity layer, and the first contact section may be provided in a region other than a region between the first gate—gate electrode layer and the third gate—gate electrode layer In this feature, a sufficient space between the first or third gate—gate electrode layer and the first contact section can be secured, so that short circuit between them can be decreased.

(c) The semiconductor device may comprise, a second adjacent memory cell which is located adjacent to a side of the memory cell where the second gate—gate electrode layer is provided, the second adjacent memory cell may include a fourth gate—gate electrode layer having a gate electrode of a fourth load transistor and a gate electrode of a fourth driver transistor, the second load transistor and the fourth load transistor may commonly use a second impurity layer as a source region, a second contact section may be provided on the second impurity layer, and the second contact section may be provided in a region other than a region between the second gate—gate electrode layer and the fourth gate—gate electrode.

(d) The first drain-gate wiring layer may be electrically connected to the second drain—drain wiring layer through a contact section, and the second drain-gate wiring layer may be electrically connected to the second gate—gate electrode layer through a contact section, and electrically connected to the first drain—drain wiring layer through a contact section.

(e) The first drain-gate wiring layer may be located in a layer lower than the second drain-gate wiring layer.

(f) The first drain-gate wiring layer may be located in a layer in which the first gate—gate electrode layer is provided.

(g) The second drain-gate wiring layer may be formed across a plurality of layers.

In the feature of (g), the second drain-gate wiring layer may include a lower layer of the second drain-gate wiring layer and an upper layer of the second drain-gate wiring layer, and the upper layer may be located in a layer over the lower layer, and electrically connected to the lower layer.

Further, in this feature, the upper layer may be electrically connected to the lower layer through a contact section.

Further, in this feature, the first gate—gate electrode layer, the second gate—gate electrode layer and the first drain-gate wiring layer may be located in a first conductive layer, the first drain—drain wiring layer, the second drain—drain wiring layer and the lower layer may be located in a second conductive layer, and the upper layer may be located in a third conductive layer.

FIG. 1 shows a relationship between an equivalent circuit of an SRAM in accordance with the present embodiment and corresponding conductive layers. The SRAM of the present embodiment is a type in which one memory cell is formed with six MOS field effect transistors. In other words, one CMOS inverter is formed with an n-channel type driver transistor Q3 and a p-channel type load transistor Q5. Also, one CMOS inverter is formed with an n-channel type driver transistor Q4 and a p-channel type load transistor Q6. These two CMOS inverters are cross-coupled to form a flip-flop. Further, one memory cell is formed from this flip-flop and n-channel type transfer transistors Q1 and Q2.

2. Structure of SRAM

A structure of the SRAM is described below. First, each figure is briefly described.

Figure 2:
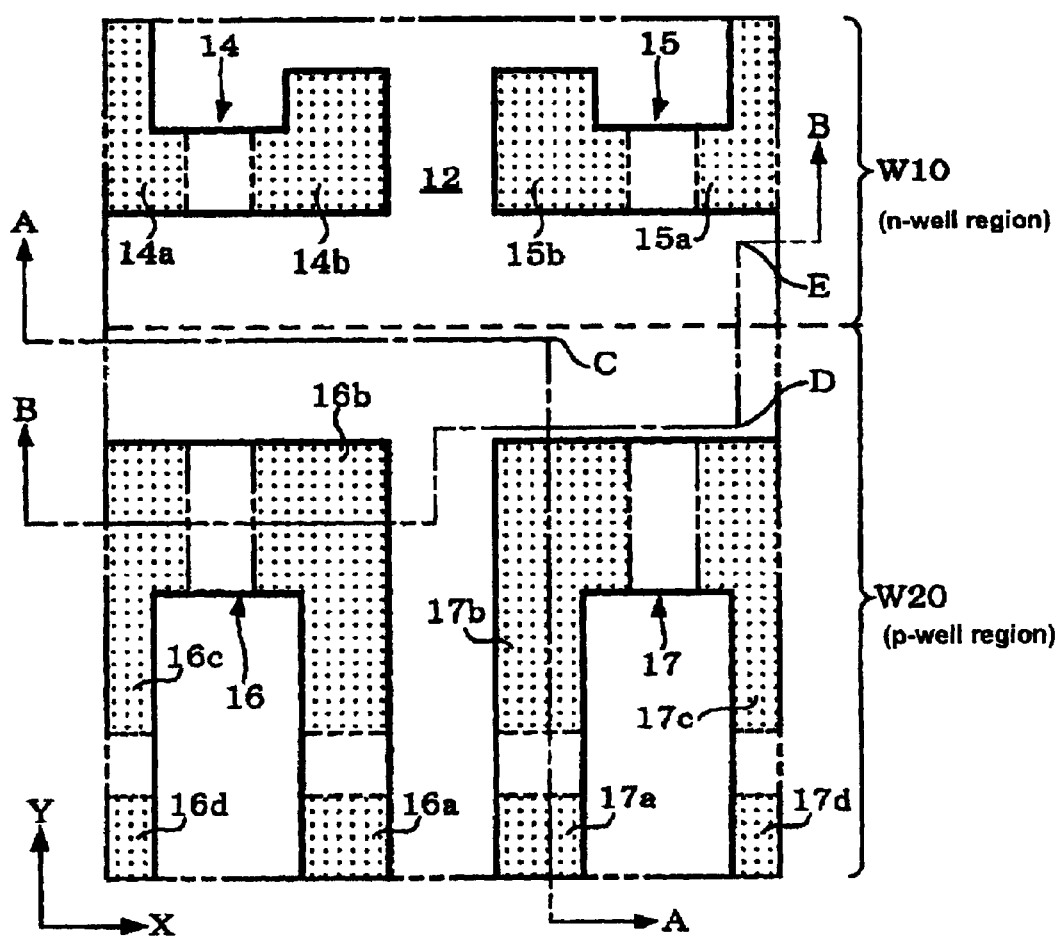
FIG. 2 schematically shows a plan view of a field of the memory cell of the SRAM in accordance with the present embodiment.
Figure 3:
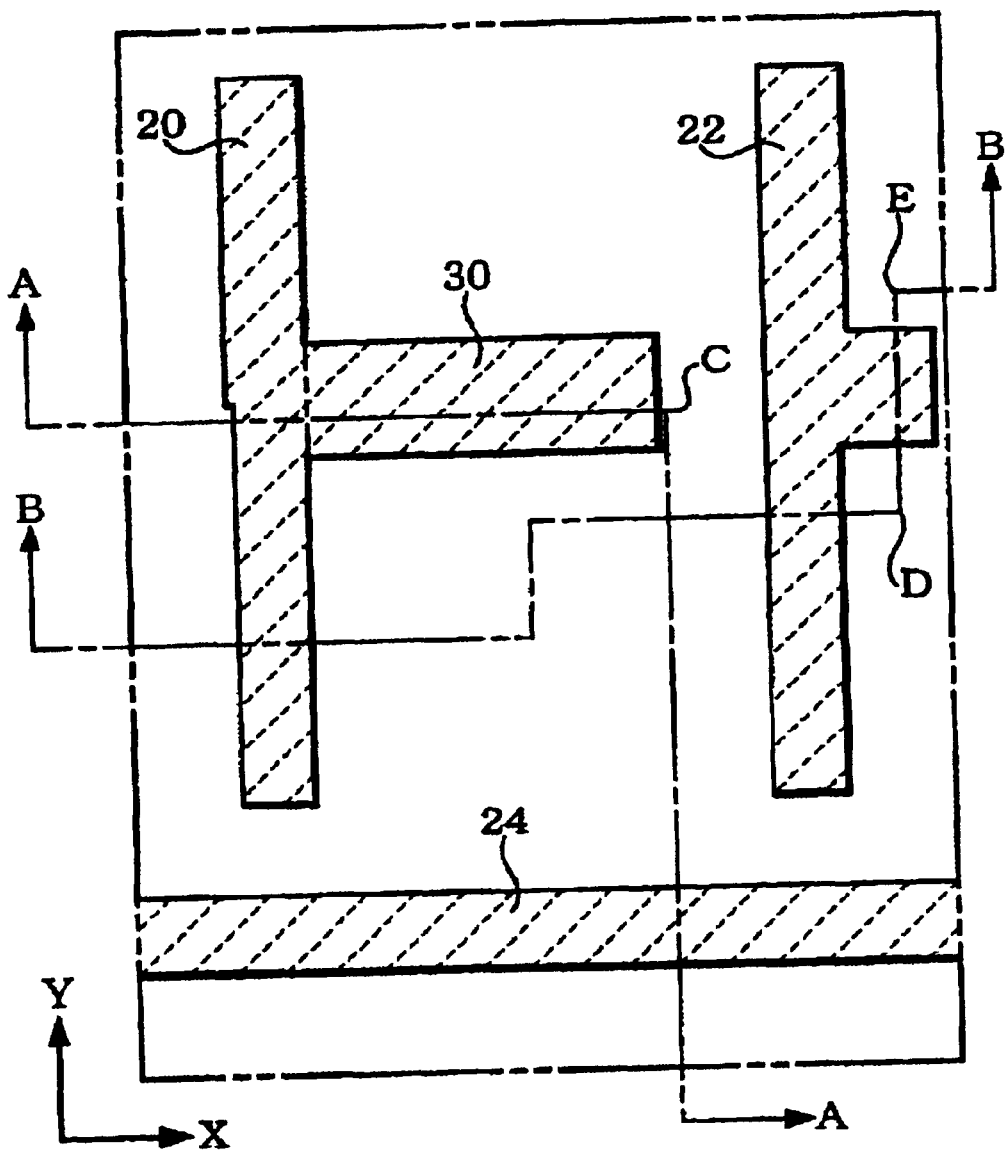
FIG. 3 schematically shows a plan view of a first conductive layer of the memory cell of the SRAM in accordance with the present embodiment.
Figure 4:
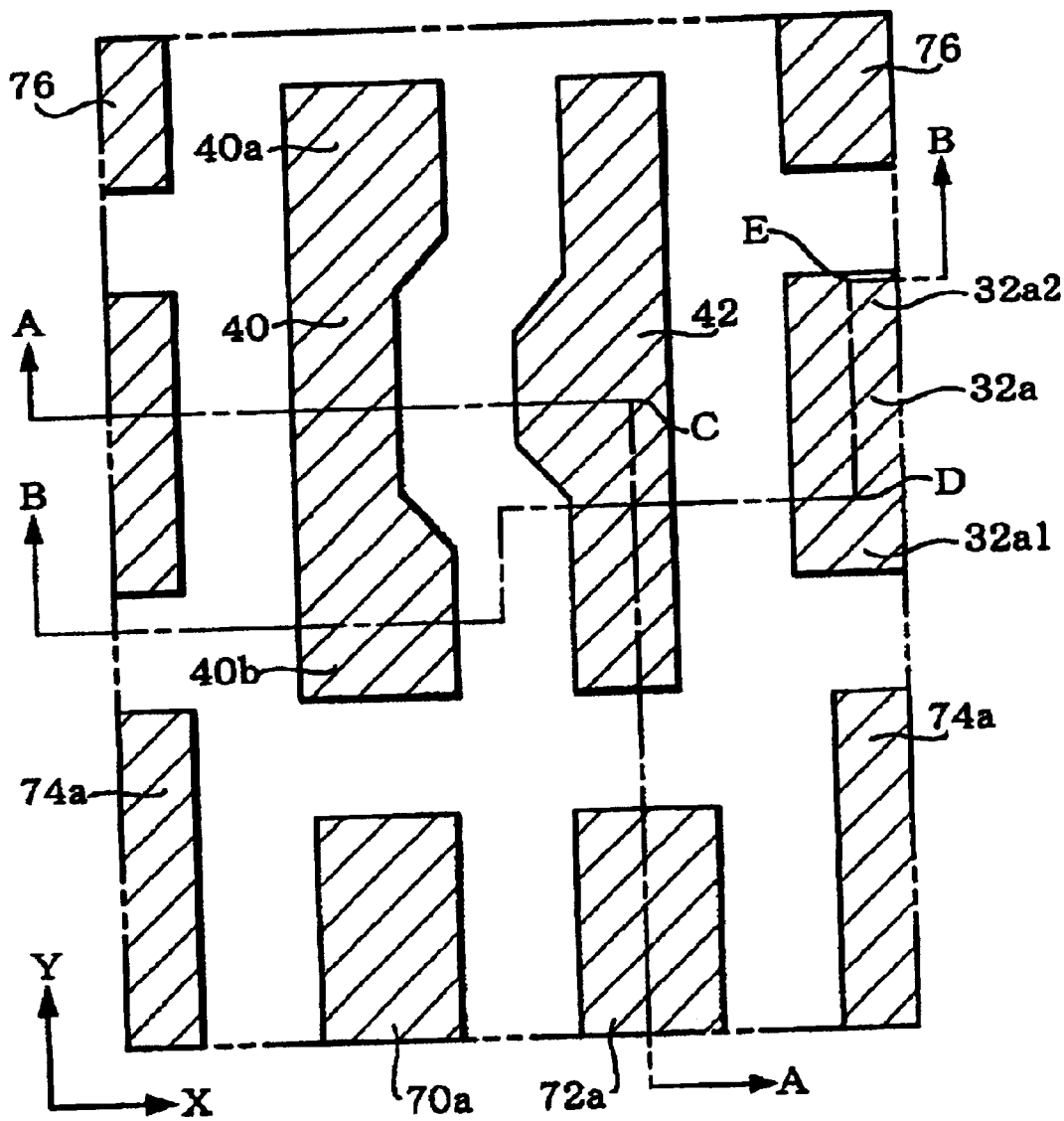
FIG. 4 schematically shows a plan view of a second conductive layer of the memory cell of the SRAM in accordance with the present embodiment.
Figure 5:
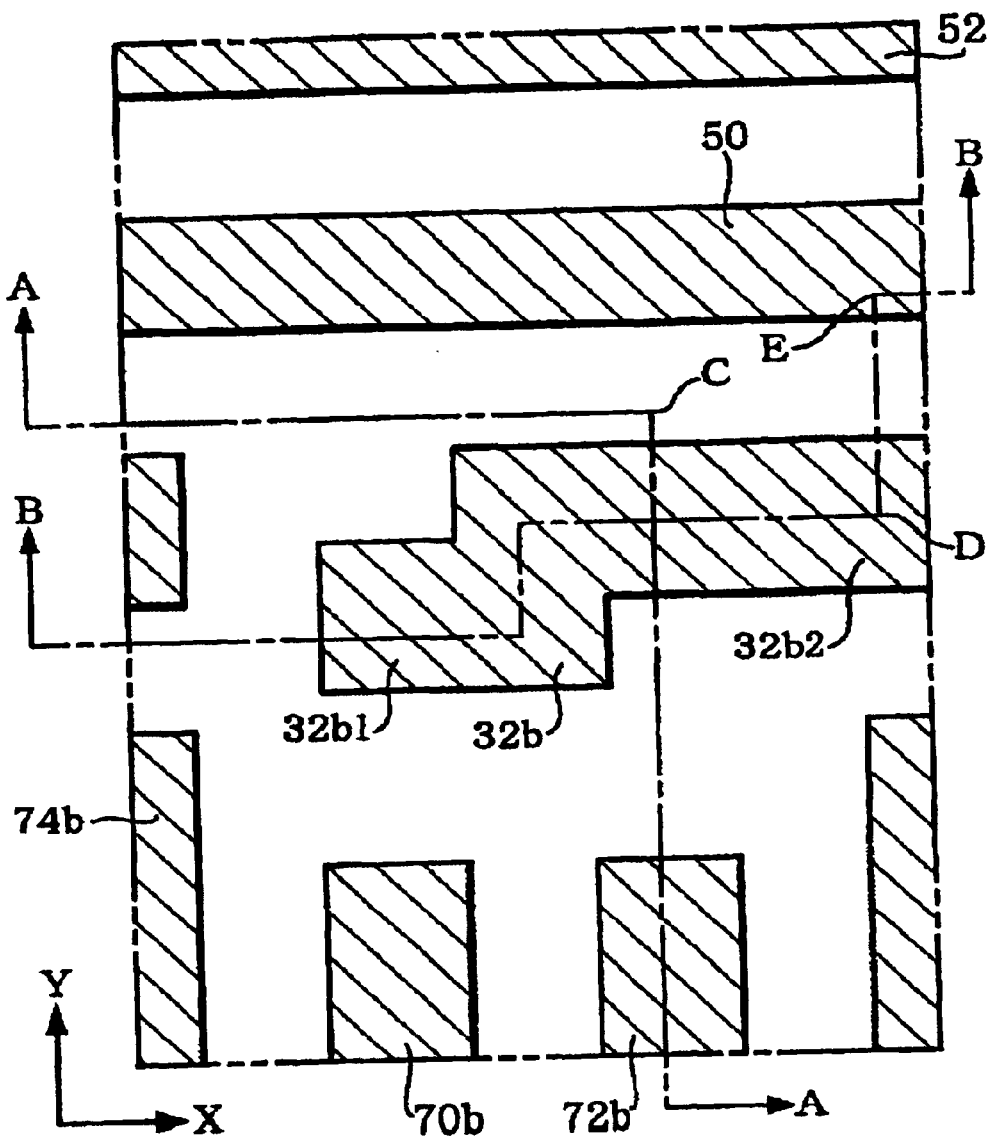
FIG. 5 schematically shows a plan view of a third conductive layer of the memory cell of the SRAM in accordance with the present embodiment.
Figure 6:
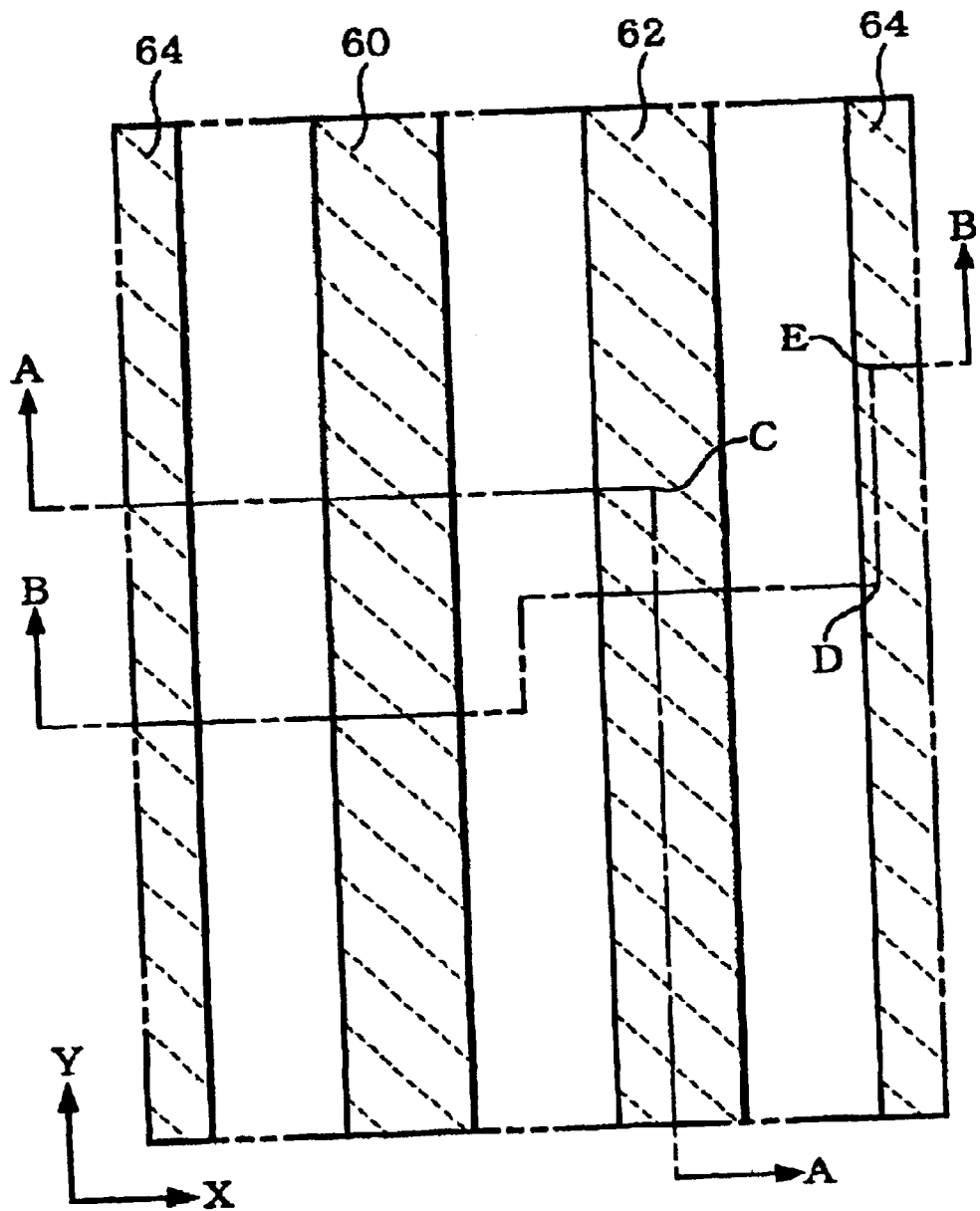
FIG. 6 schematically shows a plan view of a fourth conductive layer of the memory cell of the SRAM in accordance with the present embodiment.
Figure 7:
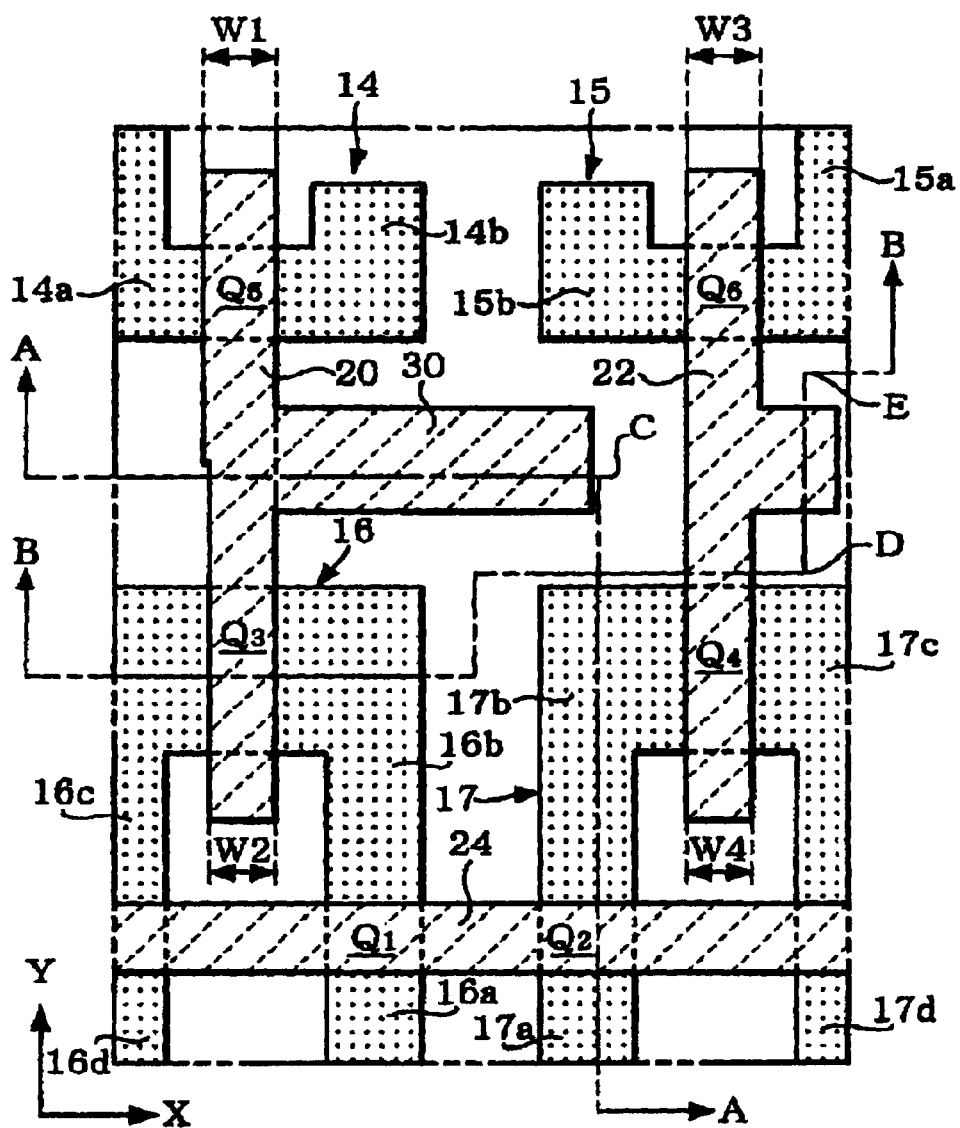
FIG. 7 schematically shows a plan view of the field and the first conductive layer of the memory cell of the SRAM in accordance with the present embodiment.
Figure 8:
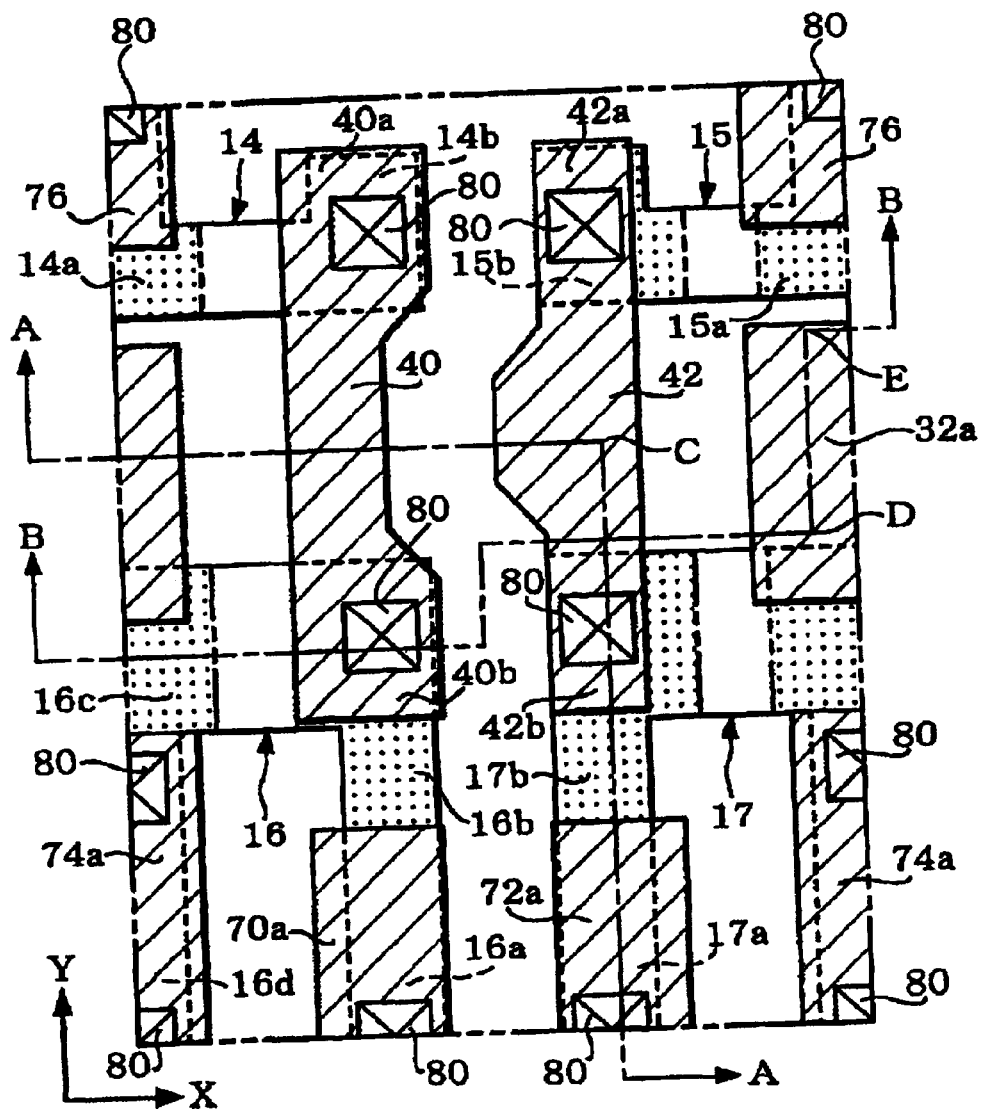
FIG. 8 schematically shows a plan view of the field and the second conductive layer of the memory cell of the SRAM in accordance with the present embodiment.
Figure 9:
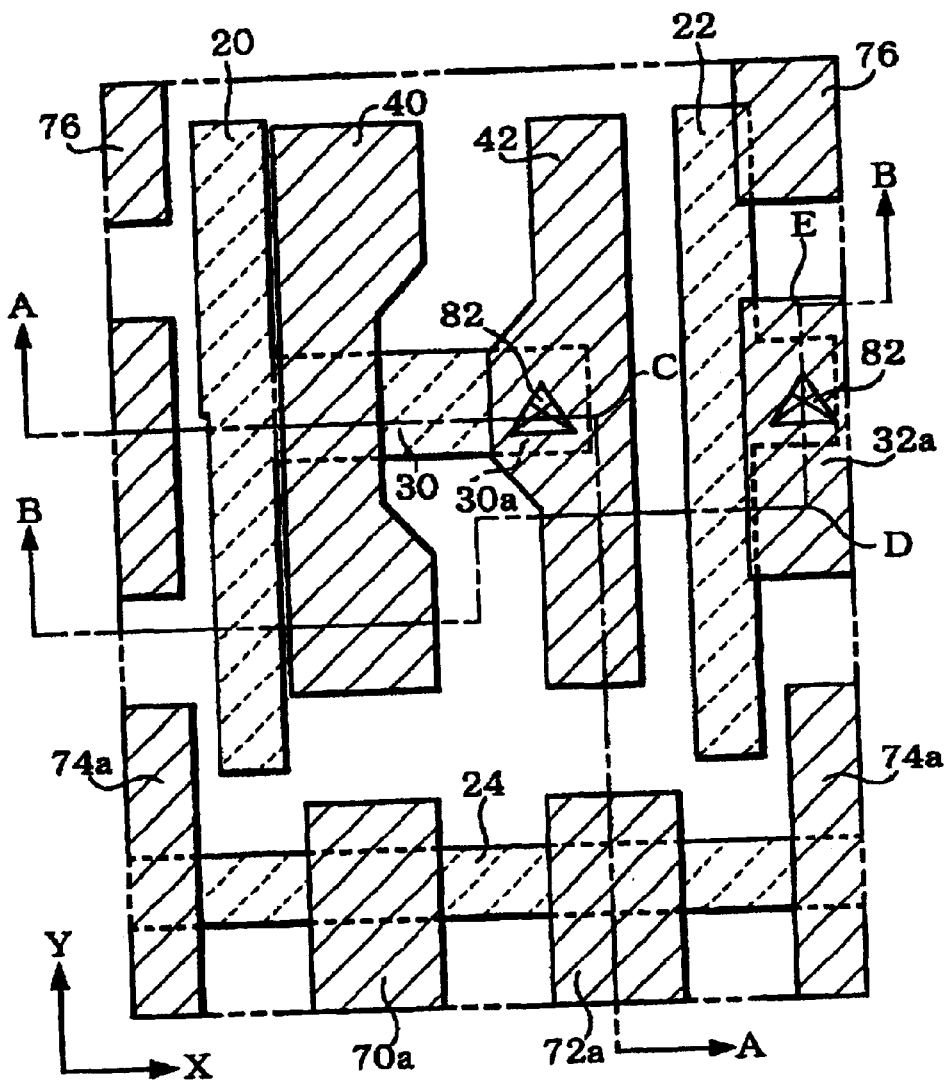
FIG. 9 schematically shows a plan view of the first conductive layer and the second conductive layer of the memory cell of the SRAM in accordance with the present embodiment.
Figure 10:
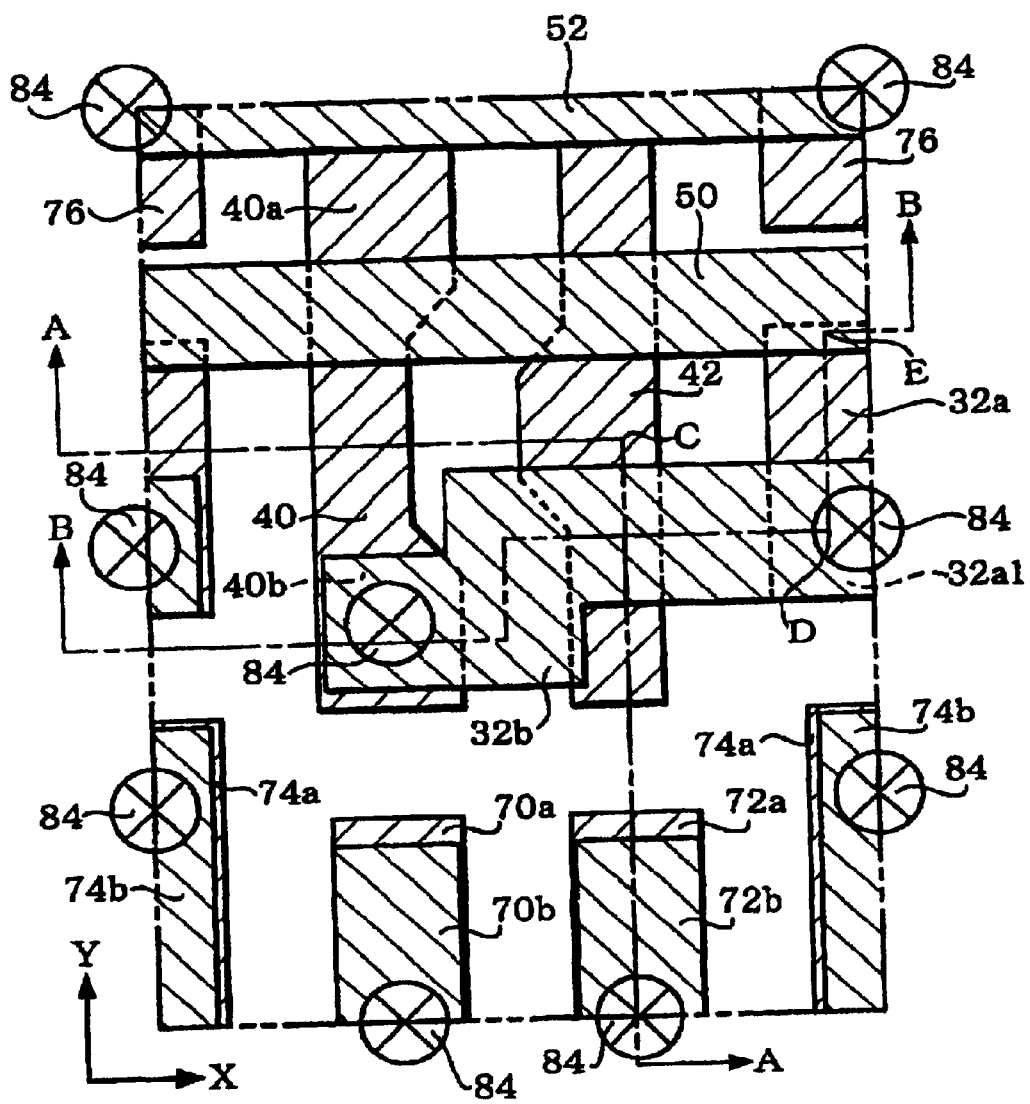
FIG. 10 schematically shows a plan view of the second conductive layer and the third conductive layer of the memory cell of the SRAM in accordance with the present embodiment.
Figure 11:
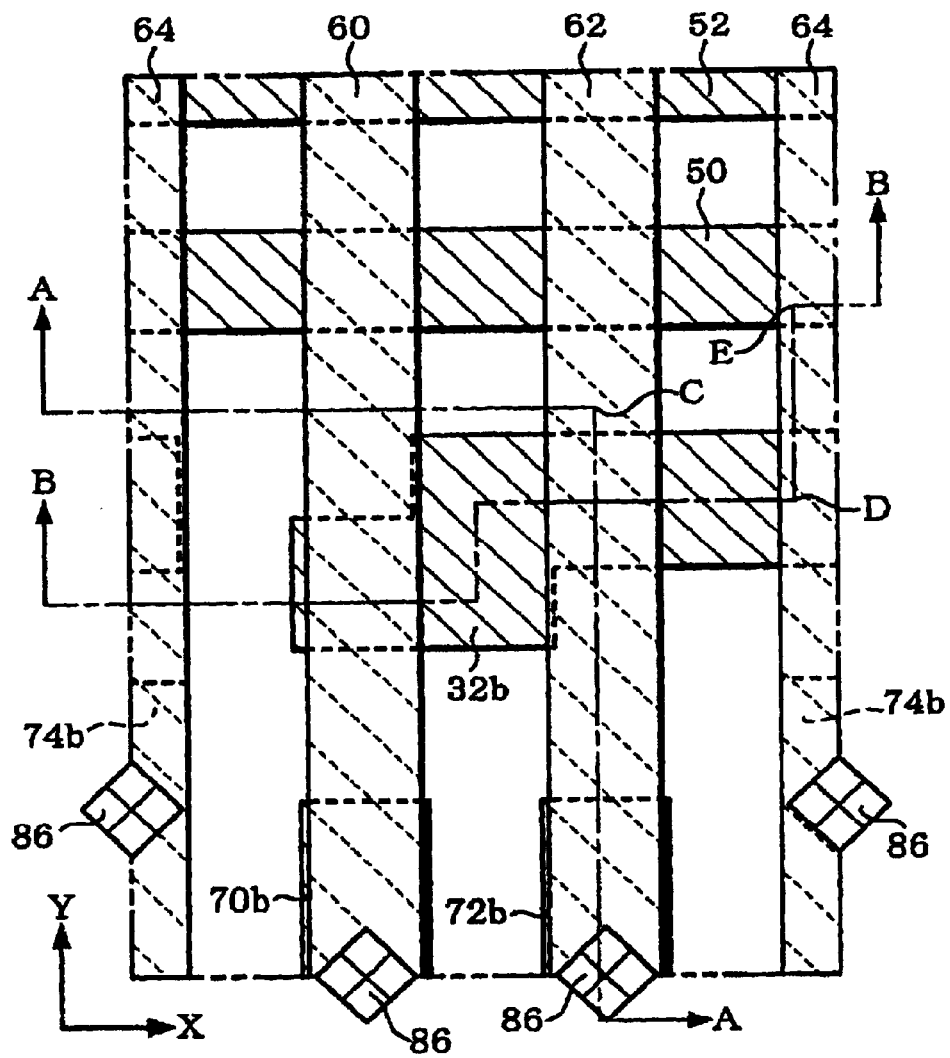
FIG. 11 schematically shows a plan view of the third conductive layer and the fourth conductive layer of the memory cell of the SRAM in accordance with the present embodiment.
Figure 12:
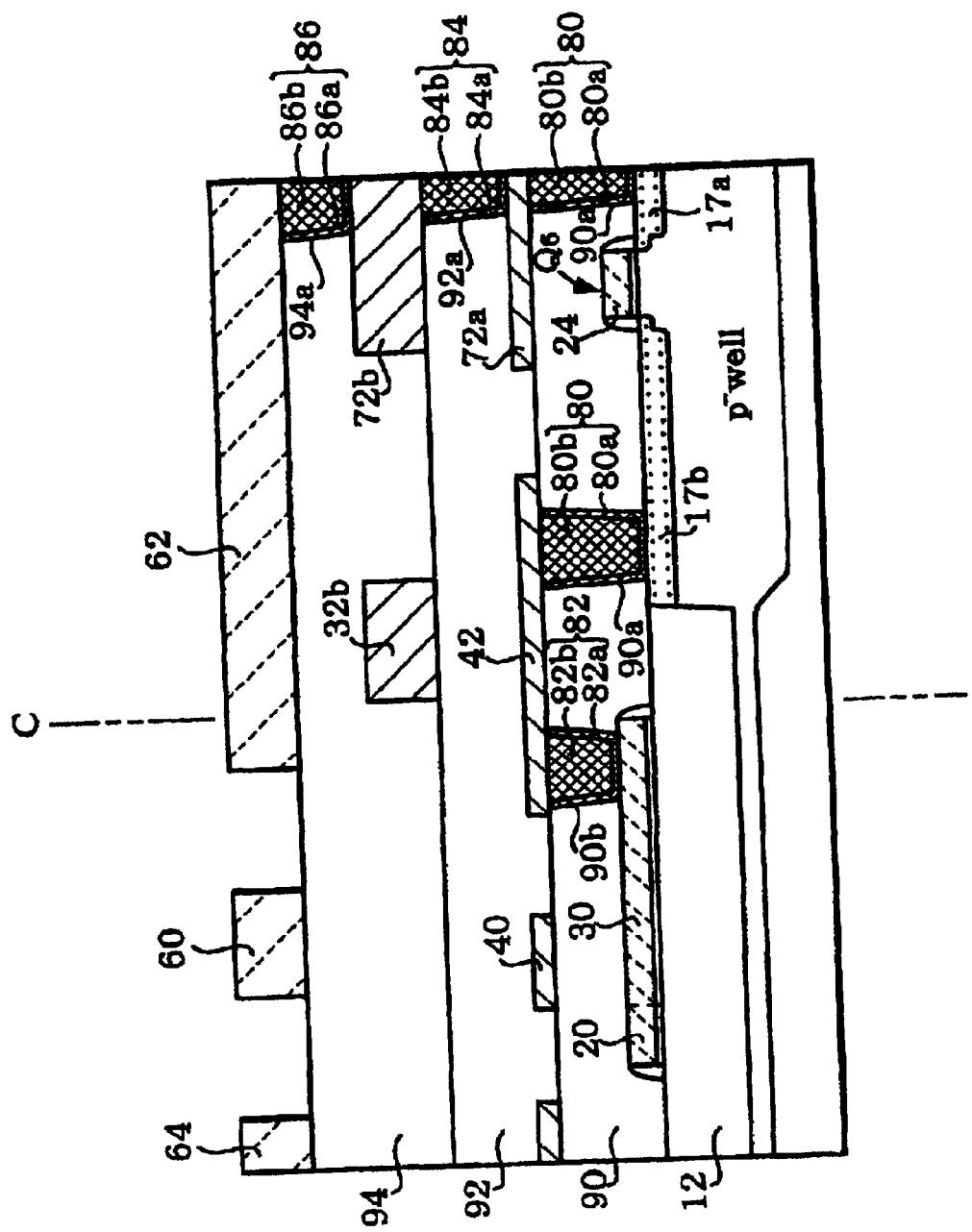
FIG. 12 schematically shows a cross-sectional view taken along a line A—A shown in FIG. 2 to FIG. 11.
Figure 13:
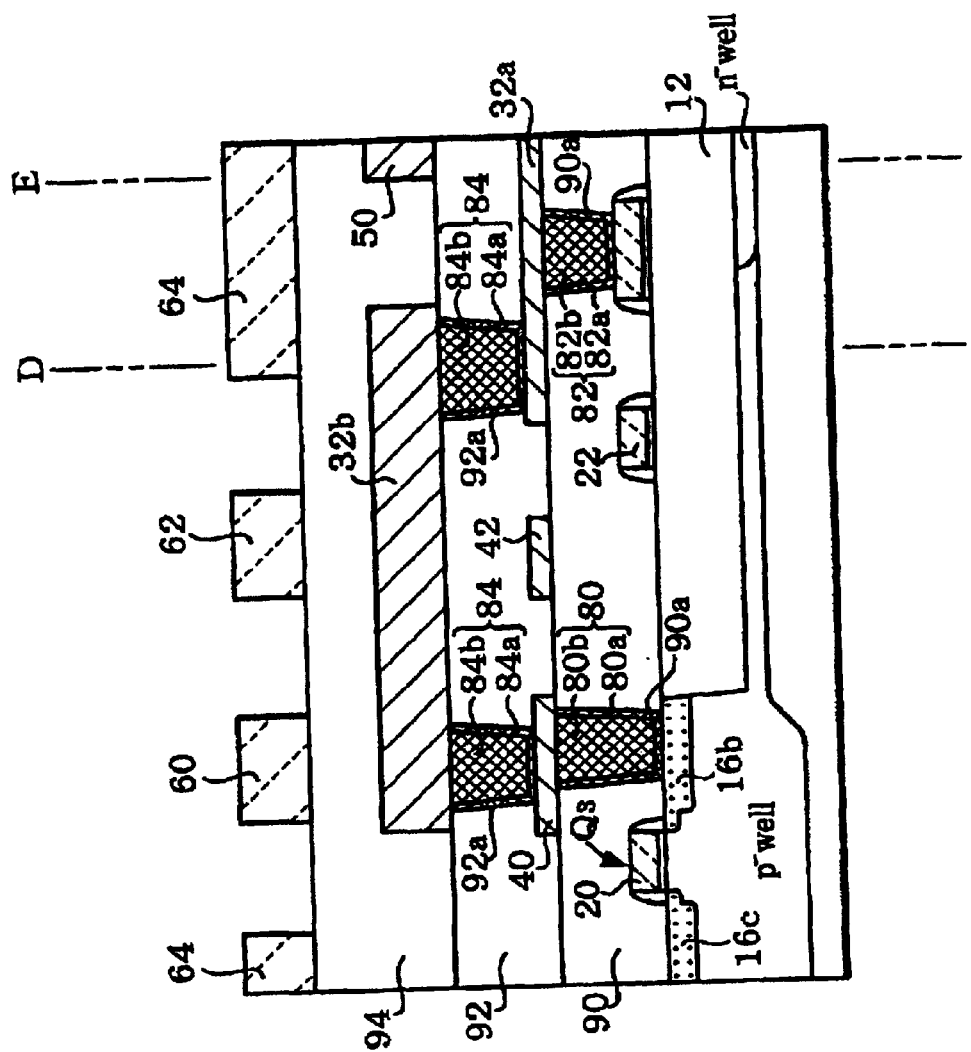
FIG. 13 schematically shows a cross-sectional view taken along a line B—B shown in FIG. 2 to FIG. 11.

FIG. 1 shows a relationship between an equivalent circuit of an SRAM in accordance with the present embodiment and corresponding conductive layers. FIG. 2 schematically shows a plan view of a field of the memory cell of the SRAM in accordance with the present embodiment. FIG. 3 schematically shows a plan view of a first conductive layer of the memory cell of the SRAM in accordance with the present embodiment. FIG. 4 schematically shows a plan view of a second conductive layer of the memory cell of the SRAM in accordance with the present embodiment. FIG. 5 schematically shows a plan view of a third conductive layer of the memory cell of the SRAM in accordance with the present embodiment. FIG. 6 schematically shows a plan view of a fourth conductive layer of the memory cell of the SRAM in accordance with the present embodiment. FIG. 7 schematically shows a plan view of the field and the first conductive layer of the memory cell of the SRAM in accordance with the present embodiment. FIG. 8 schematically shows a plan view of the field and the second conductive layer of the memory cell of the SRAM in accordance with the present embodiment. FIG. 9 schematically shows a plan view of the first conductive layer and the second conductive layer of the memory cell of the SRAM in accordance with the present embodiment. FIG. 10 schematically shows a plan view of the second conductive layer and the third conductive layer of the memory cell of the SRAM in accordance with the present embodiment. FIG. 11 schematically shows a plan view of the third conductive layer and the fourth conductive layer of the memory cell of the SRAM in accordance with the present embodiment. FIG. 12 schematically shows a cross-sectional view taken along a line A—A shown in FIG. 2 to FIG. 11. FIG. 13 schematically shows a cross-sectional view taken along a line B—B shown in FIG. 2 to FIG. 11.

The SRAM is formed including an element forming region formed in a field, a first conductive layer, a second conductive layer, a third conductive layer, and a fourth conductive layer. The structure of each of the field, and the first through fourth conductive layers is concretely described below.

2.1 Field

Referring to FIG. 2, the field is described. The field includes first through fourth active regions 14, 15, 16 and 17, and an element isolation region 12. The first through fourth active regions 14, 15, 16 and 17 are defined by the element isolation region 12. A region on the side where the first and second active regions 14 and 15 are formed is an n-type well region W10, and a region on the side where the third and fourth active regions 16 and 17 are formed is a p-type well region W20.

The first active region 14 and the second active region 15 are disposed in a symmetrical relation in a plane configuration. Also, the third active region 16 and the fourth active region 17 are disposed in a symmetrical relation in a plane configuration.

The first load transistor Q5 is formed in the first active region 14. In the first active region 14, a first p$^+$-type impurity layer 14a and a second p$^+$-type impurity layer 14b are formed. The first p$^+$-type impurity layer 14a functions as a source of the first load transistor Q5. The second p$^+$-type impurity layer 14b functions as a drain of the first load transistor Q5.

The second load transistor Q6 is formed in the second active region 15. In the second active region 15, a third p$^+$-type impurity layer 15a and a fourth p$^+$-type impurity layer 15b are formed. The third p$^+$-type impurity layer 15a functions as a source of the second load transistor Q6. The fourth p$^+$-type impurity layer 15b functions as a drain of the second load transistor Q6.

In the third active region 16, the first driver transistor Q3 and the first transfer transistor Q1 are formed. In the third active region 16, first through third n$^+$-type impurity layers 16a, 16b and 16c that are to become components of the transistors Q1 and Q3, and a fifth p$^+$-type impurity layer 16d that composes a well contact region are formed. The first n$^+$-type impurity layer 16a functions as a source or a drain of the first transfer transistor Q1. The second n$^+$-type impurity layer 16b functions as a drain of the first driver transistor Q3 and a source or a drain of the first transfer transistor Q1. The third n$^+$-type impurity layer 16c functions as a source of the first driver transistor Q3.

In the fourth active region 17, the second driver transistor Q4 and the second transfer transistor Q2 are formed. In the fourth active region 17, fourth through sixth n$^+$-type impurity layers 17a, 17b and 17c that are to become components of the transistors Q2 and Q4, and a sixth p$^+$-type impurity layer 17d that composes a well contact region are formed. The fourth n$^+$-type impurity layer 17a functions as a source or a drain of the second transfer transistor Q2. The fifth n$^+$-type impurity layer 17b functions as a drain of the second driver transistor Q4 and a source or a drain of the second transfer transistor Q2. The sixth n$^+$-type impurity layer 17c functions as a source of the second driver transistor Q4.

2.2 First Conductive Layer

Referring to FIG. 3 and FIG. 7, the first conductive layer will be described. It is noted that the first conductive layer means a conductive layer that is formed on the field (semiconductor layer) 10.

The first conductive layer includes a first gate—gate electrode layer 20, a second gate—gate electrode layer 22, a first drain-gate wiring layer 30 and an auxiliary word line 24.

The first gate—gate electrode layer 20 and the second gate—gate electrode layer 22 are formed in a manner to extend along a Y direction. The first drain-gate wiring layer 30 and the auxiliary word line 24 are formed in a manner to extend along an X direction.

Components of the first conductive layer are described concretely below.

1) First Gate—Gate Electrode Layer

The first gate—gate electrode layer 20 is formed in a manner to traverse the first active region 14 and the third active region 16, as shown in FIG. 7. The first gate—gate electrode layer 20 functions as a gate electrode of the first load transistor Q5 and the first driver transistor Q3.

The first gate—gate electrode layer 20 is formed in a manner to pass between the first p$^+$-type impurity layer 14a and the second p$^+$-type impurity layer 14b, in the first active region 14. In other words, the first gate—gate electrode layer 20, the first p$^+$-type impurity layer 14a and the second p$^+$-type impurity layer 14b form the first load transistor Q5. Also, the first gate—gate electrode layer 20 is formed in a manner to pass between the second n$^+$-type impurity layer 16a and the third n$^+$-type impurity layer 16c, in the third active region 16. In other words, the first gate—gate electrode layer 20, the second n$^+$-type impurity layer 16a and the third n$^+$-type impurity layer 16c form the first driver transistor Q3.

The width W1 of the first gate—gate electrode layer 20 in the first load transistor Q5 is set to be larger than the width W2 of the first gate—gate electrode layer 20 in the first driver transistor Q3. The resultant effects will be described below in a section "Effects". The width W1 of the first gate—gate electrode layer 20 in the first load transistor Q5 is not limited to a particular value unless it is larger than the width W2 of the first gate—gate electrode layer 20, and for example, may be 0.14 $\mu$m to 0.18 $\mu$m. The width W2 of the first gate—gate electrode layer 20 in the first driver transistor Q3 is not limited to a particular value unless it is smaller than the width W1 of the first gate—gate electrode layer 20, and for example, may be 0.12 $\mu$m to 0.16 $\mu$m.

2) First Drain-Gate Wiring Layer

The first drain-gate wiring layer 30 is formed in a manner to extend in the X direction from a side section of the first gate—gate electrode layer 20 toward the second gate—gate electrode layer 22. Also, as shown in FIG. 7, the first drain-gate wiring layer 30 is formed at least between the first active region 14 and the third active region 16.

3) Second Gate—Gate Electrode Layer

The second gate—gate electrode layer 22 is formed in a manner to traverse the second active region 15 and the fourth active region 17, as shown in FIG. 7. The second gate—gate electrode layer 22 functions as a gate electrode of the second load transistor Q6 and the second driver transistor Q4.

The second gate—gate electrode layer 22 is formed in a manner to pass between the third p$^+$-type impurity layer 15a and the fourth p$^+$-type impurity layer 15b, in the second active region 15. In other words, the second gate—gate electrode layer 22, the third p$^+$-type impurity layer 15a and the fourth p$^+$-type impurity layer 15b form the second load transistor Q6. Also, the second gate—gate electrode layer 22 is formed in a manner to pass between the fifth n$^+$-type impurity layer 17b and the sixth n$^+$-type impurity layer 17c, in the fourth active region 17. In other words, the second gate—gate electrode layer 22, the fifth n$^+$-type impurity layer 17b and the sixth n$^+$-type impurity layer 17c form the second driver transistor Q4.

The width W3 of the second gate—gate electrode layer 22 in the second load transistor Q6 is set to be larger than the width W4 of the second gate—gate electrode layer 22 in the second driver transistor Q4. The resultant effects will be described below in the section "Effects". The width W3 of the second gate—gate electrode layer 22 in the second load transistor Q6 is not limited to a particular value unless it is larger than the width W4 of the second gate—gate electrode layer 22, and for example, may be 0.14 μm to 0.18 μm. The width W4 of the second gate—gate electrode layer 22 in the second driver transistor Q4 is not limited to a particular value unless it is smaller than the width W3 of the second gate—gate electrode layer 22, and for example, may be 0.12 μm to 0.16 μm.

4) Auxiliary Word Line

The auxiliary word line 24 is formed in a manner to traverse the third active region 16 and the fourth active region 17, as shown in FIG. 7. The auxiliary word line 24 functions as a gate electrode of the first and second transfer transistors Q1 and Q2.

The auxiliary word line 24 is formed in a manner to pass between the first n$^+$-type impurity layer 16a and the second n$^+$-type impurity layer 16b, in the third active region 16. In other words, the auxiliary word line 24, the first n$^+$-type impurity layer 16a and the second n$^+$-type impurity layer 16b form the first transfer transistor Q1. Also, the auxiliary word line 24 is formed in a manner to pass between the fourth n$^+$-type impurity layer 17a and the fifth n$^+$-type impurity layer 17b, in the fourth active region 17. In other words, the auxiliary word line 24, the fourth n$^+$-type impurity layer 17a and the fifth n$^+$-type impurity layer 17b form the second transfer transistor Q2.

5) Cross-Sectional Structure of First Conductive Layer and Others

The first conductive layer may be formed by successively depositing a polysilicon layer and a silicide layer in layers.

As shown in FIG. 12 and FIG. 13, a first interlayer dielectric layer 90 is formed on the field and the first conductive layer. The first inter layer dielectric layer 90 may be formed through a planarization process utilizing, for example, a chemical mechanical polishing method.

2.3 Second Conductive Layer

Referring to FIG. 4, FIG. 8 and FIG. 9, the second conductive layer will be described below. It is noted that the second conductive layer means a conductive layer that is formed on the first interlayer dielectric layer 90.

The second conductive layer includes, as shown in FIG. 4, a first drain—drain wiring layer 40, a second drain—drain wiring layer 42, a lower layer 32a of the second drain-gate wiring layer, a first BL contact pad layer 70a, a first bar-BL contact pad layer 72a, a first Vss contact pad layer 74a and a Vdd contact pad layer 76.

The first drain—drain wiring layer 40, the second drain—drain wiring layer 42 and the lower layer 32a of the second drain-gate wiring layer are formed in a manner to extend along the Y direction. The first drain—drain wiring layer 40, the second drain—drain wiring layer 42 and the lower layer 32a of the second drain-gate wiring layer are successively disposed in the X direction.

Components of the second conductive layer are concretely described below.

1) First Drain—Drain Wiring Layer

The first drain—drain wiring layer 40 has portions that overlap the first active region 14 and the third active region 16 as viewed in a plan view (see FIG. 8). More concretely, one end portion 40a of the first drain—drain wiring layer 40 is located above the second p$^+$-type impurity layer 14b. The one end portion 40a of the first drain—drain wiring layer 40 and the second p$^+$-type impurity layer 14b are electrically connected to each other through a contact section between the field and the second conductive layer (herein blew referred to as a "field/second-layer contact section") 80. The other end portion 40b of the first drain—drain wiring layer 40 is located above the second n$^+$-type impurity layer 16b. The other end portion 40b of the first drain—drain wiring layer 40 and the second n$^+$-type impurity layer 16b are electrically connected to each other through the field/second-layer contact section 80.

2) Second Drain—Drain Wiring Layer

The second drain—drain wiring layer 42 has portions that overlap the second active region 15 and the fourth active region 17 as viewed in a plan view (see FIG. 8). More concretely, one end portion 42a of the second drain—drain wiring layer 42 is located above the fourth p$^+$-type impurity layer 15b. The one end portion 42a of the second drain—drain wiring layer 42 and the fourth p$^+$-type impurity layer 15b are electrically connected to each other through the field/second-layer contact section 80. The other end portion 42b of the second drain—drain wiring layer 42 is located above the fifth n$^+$-type impurity layer 17b. The other end portion 42b of the second drain—drain wiring layer 42 and the fifth n$^+$-type impurity layer 17b are electrically connected to each other through the field/second-layer contact section 80.

Further, the second drain—drain wiring layer 42 has a portion that overlaps an end portion 30a of the first drain-gate wiring layer 30 as viewed in a plan view (see FIG. 9). The second drain—drain wiring layer 42 and the end portion 30a of the first drain-gate wiring layer 30 are electrically connected to each other through a contact section between the first conductive layer and the second conductive layer (hereafter referred to as a "first-layer/second-layer contact section") 82.

3) Lower layer of Second Drain-Gate Wiring Layer

The lower layer 32a of the second drain-gate wiring layer is formed on the opposite side of the first drain—drain wiring layer 40 with respect to the second drain—drain wiring layer 42 as being a reference. The lower layer 32a of the second drain-gate wiring layer has a portion that overlaps the second gate—gate electrode layer 22 as viewed in a plan view (see FIG. 9). The lower layer 32a of the second drain-gate wiring layer, and the second gate—gate electrode layer 22 are electrically connected to each other through the first-layer/second-layer contact section 82.

4) First BL Contact Pad Layer

The first BL contact pad layer 70a is located above the first n$^+$-type impurity layer 16a in the third active region 16 (see FIG. 8). The first BL contact pad layer 70a and the first n$^+$-type impurity layer 16a are electrically connected to each other through the field/second-layer contact section 80.

5) First Bar-BL Contact Pad Layer

The first bar-BL contact pad layer 72a is located above the fourth n+-type impurity layer 17a in the fourth active region 17 (see FIG. 8). The first bar-BL contact pad layer 72a and the fourth n+-type impurity layer 17a are electrically connected to each other through the field/second-layer contact section 80.

6) First Vss Contact Pad Layer

The first Vss contact pad layers 74a are located above the sources of the driver transistors Q3 and Q4 (for example, the third n+-type impurity layer 16c) and the well contact region (for example, the fifth p+-type impurity layer 16d) (see FIG. 8). Each of the first Vss contact pad layers 74a is electrically connected to the source of each of the driver transistors Q3 and Q4 (for example, the third n+-type impurity layer 16c) through the field/second-layer contact section 80. Also, the first Vss contact pad layer 74a is electrically connected to the well contact region (for example, the fourth p+-type impurity layer 16d) through the field/second-layer contact section 80.

7) Vdd Contact Pad Layer

Each of the Vdd contact pad layers 76 is located above the source (for example, the first p+-type impurity layer 14a) of each of the load transistors Q5 and Q6. Each of the Vdd contact pad layers 76 is electrically connected to the source (for example, the first p+-type impurity layer 14a) of each of the load transistors Q5 and Q6 through the field/second-layer contact section 80.

8) Cross-Sectional Structure of Second Conductive Layer

A cross-sectional structure of the second conductive layer will be described with reference to FIG. 12 and FIG. 13. The second conductive layer may be formed only from, for example, a nitride layer of a refractory metal. The thickness of the second conductive layer may be for example 100 nm to 200 nm, and more specifically be 140 nm to 160 nm. The nitride layer of a refractory metal may be formed from, for example, titanium nitride. Because the second conductive layer is formed from a nitride layer of a refractory metal, the thickness of the second conductive layer can be made smaller, and miniaturizing processing thereof can be readily conducted. Accordingly, the cell area can be reduced.

Also, the second conductive layer may be composed in either one of the following embodiments. 1) It may have a structure in which a nitride layer of a refractory metal is formed on a metal layer formed from a refractory metal. In this case, the metal layer formed from a refractory metal is an under-layer, and may be composed of a titanium layer, for example. Titanium nitride may be listed as a material of the nitride layer of a refractory metal. 2) The second conductive layer maybe composed only of a metal layer of a refractory metal.

A cross-sectional structure of the field/second-layer contact section 80 will be described with reference to FIG. 12 and FIG. 13. The field/second-layer contact section 80 is formed in a manner to fill a through hole 90a that is formed in the first interlayer dielectric layer 90. The field/second-layer contact section 80 includes a barrier layer 80a, and a plug 80b formed over the barrier layer 80a. Titanium and tungsten may be listed as material of the plugs. The barrier layer 80a may be formed from a metal layer of a refractory metal, and a nitride layer of a refractory metal formed over the metal layer. For example, titanium may be listed as material of the metal layer of a refractory metal. Titanium nitride, for example, may be listed as material of the nitride layer of a refractory metal.

Figure 16:
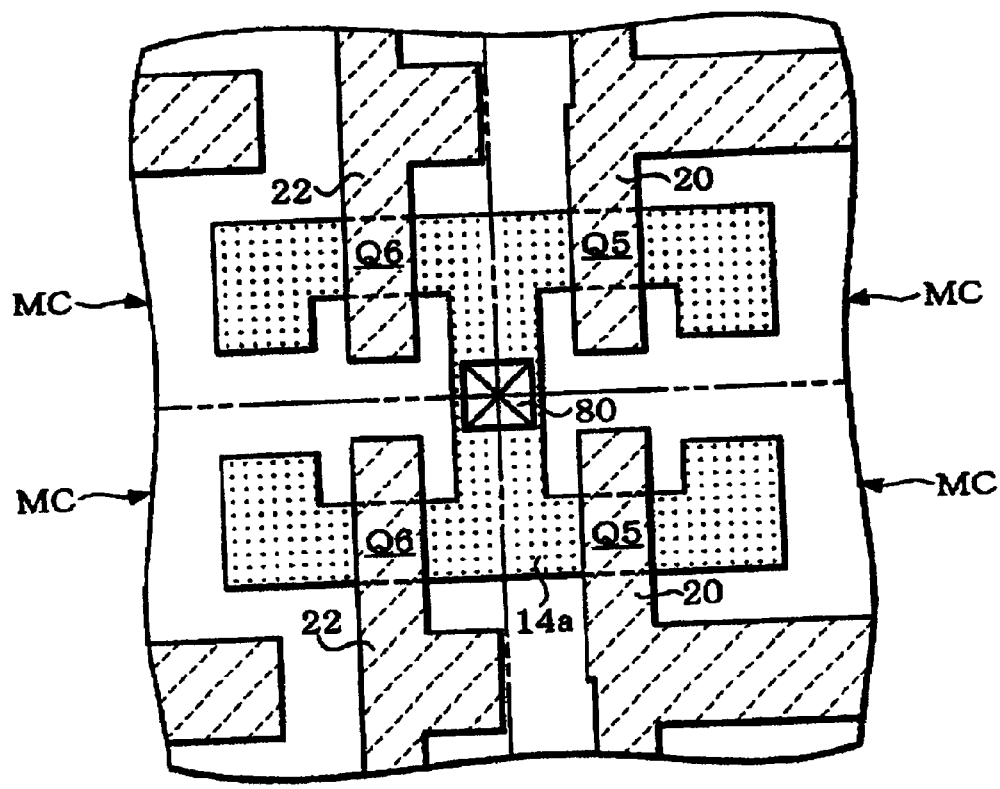
FIG. 16 schematically shows a plan view of a composition example of a field/second-layer contact section to lead out a source of a load transistor.

Among the field/second-layer contact section 80, the contact section 80 that connects the source of the load transistors Q5 and Q6 (for example, the first p+-type impurity layer 14a or the third p+-type impurity layer 15a) and the Vdd contact pad layer 76 may be provided in the following manner. It is noted that, as shown in FIG. 16, the case in which the load transistor Q5 in one memory cell MC and the load transistor Q6 in an adjacent memory cell commonly use one impurity layer 14a as their source is considered. In this case, the field/second-layer contact section 80 can be provided in a region other than the area between the gate—gate electrode layer 20 in one memory cell MC and the gate—gate electrode layer 22 in another memory cell MC. The resultant effects will be described below in the section "Effects".

A cross-sectional structure of the first-layer/second-layer contact section 82 will be described with reference to FIG. 12 and FIG. 13. The first-layer/second-layer contact section 82 is formed in a manner to fill a through hole 90b that is formed in the first interlayer dielectric layer 90. The first-layer/second-layer contact section 82 may have the same structure as that of the field/second-layer contact section 80 described above.

A second interlayer dielectric layer 92 is formed in a manner to cover the second conductive layer. The second interlayer dielectric layer 92 may be formed through a planarization process using, for example, a chemical mechanical polishing method.

2.4 Third Conductive Layer

The third conductive layer will be described below with reference to FIG. 5 and FIG. 10. It is noted that the third conductive layer means a conductive layer that is formed on the second interlayer dielectric layer 92 (see FIG. 12 and FIG. 13).

The third conductive layer includes an upper layer 32b of the second drain-gate wiring layer, a main word line 50, a Vdd wiring 52, a second BL contact pad layer 70b, a second bar-BL contact pad layer 72b and a second Vss contact pad layer 74b.

The upper layer 32b of the second drain-gate wiring layer, the main word line 50 and the Vdd wiring 53 are formed in a manner to extend along the X direction. The second BL contact pad layer 70b, the second bar-BL contact pad layer 72b and the second Vss contact pad layer 74b are formed in a manner to extend in the Y direction.

Components of the third conductive layer are concretely described below.

1) Upper Layer of the Second Drain-Gate Wiring Layer

The upper layer 32b of the second drain-gate wiring layer is formed in a manner to traverse the second drain—drain wiring layer 42 in the second conductive layer, as shown in FIG. 10. More concretely, the upper layer 32b of the second drain-gate wiring layer is formed from an area above the end portion 40b of the first drain—drain wiring layer 40 to an area above an end portion 32a1 of the lower layer 32a of the second drain-gate wiring layer. The upper layer 32b of the second drain-gate wiring layer is electrically connected to the end portion 40b of the first drain—drain wiring layer 40 through a contact section between the second conductive layer and the third conductive layer (herein after referred to as a "second-layer/third-layer contact section") 84. Also, the upper layer 32b of the second drain-gate wiring layer is electrically connected to the end portion 32a1 of the lower layer 32a of the second drain-gate wiring layer through the second-layer/third-layer contact section 84.

As shown in FIG. 1, the first drain—drain wiring layer 40 in the second conductive layer and the second gate—gate electrode layer 22 in the first conductive layer are electrically connected to each other through the second-layer/third-layer contact section 84, the upper layer 32b of the second drain-gate wiring layer, the second-layer/third-layer contact section 84, the lower layer 32a of the second drain-gate wiring layer, and the first-layer/second-layer contact section 82.

2) Vdd Wiring

The Vdd wiring 52 is formed in a manner to pass over the Vdd contact pad layer 76, as shown in FIG. 10. The Vdd wiring 52 is electrically connected to the Vdd contact pad layer 76 through the second-layer/third-layer contact section 84.

3) Second BL Contact Pad Layer

The second BL contact pad layer 70b is located above the first BL contact pad layer 70a. The second BL contact pad layer 70b is electrically connected to the first BL contact pad layer 70a through the second-layer/third-layer contact section 84.

4) Second Bar-BL Contact Pad Layer

The second bar-BL contact pad layer 72b is located above the first bar-BL contact pad layer 72a. The second bar-BL contact pad layer 72b is electrically connected to the first bar-BL contact pad layer 72a through the second-layer/third-layer contact section 84.

5) Second Vss Contact Pad Layer

The second Vss contact pad layer 74b is located above the second Vss contact pad layer 74a. The second Vss contact pad layer 74b is electrically connected to the first Vss contact pad layer 74a through the second-layer/third-layer contact section 84.

6) Cross-Sectional Structure of Third Conductive Layer

A cross-sectional structure of the third conductive layer will be described with reference to FIG. 12 and FIG. 13. The third conductive layer has a structure in which, for example, a nitride layer of a refractory metal, a metal layer, and a nitride layer of a refractory metal, in this order from the bottom, are successively stacked in layers. For example, titanium nitride may be listed as material of the nitride layer of a refractory metal. Aluminum, copper or an alloy of these metals, for example, may be listed as material of the metal layer.

A cross-sectional structure of the second-layer/third-layer contact section 84 will be described. The second-layer/third-layer contact section 84 is formed in a manner to fill a through hole 92a formed in the second interlayer dielectric layer 92. The second-layer/third-layer contact section 84 may be provided with the same structure as that of the field/second-layer contact section 80 described above.

A third interlayer dielectric layer 94 is formed in a manner to cover the third conductive layer. The third interlayer dielectric layer 94 may be formed through a planarization process using, for example a chemical mechanical polishing method.

2.5 Fourth Conductive Layer

The fourth conductive layer will be described below with reference to FIG. 6 and FIG. 11. It is noted that the fourth conductive layer means a conductive layer that is formed on the third interlayer dielectric layer 94.

The fourth conductive layer includes a bit line 60, a bit-bar line 62 and a Vss wiring 64.

The bit line 60, the bit-bar line 62 and the Vss wiring 64 are formed in a manner to extend along the Y direction.

Compositions of the bit line 60, the bit-bar line 62 and the Vss wiring 64 are concretely described below.

1) Bit Line

The bit line 60 is formed in a manner to pass over the second BL contact pad layer 70b, as shown in FIG. 11. The bit line 60 is electrically connected to the second BL contact pad layer 70b through a contact section between the third conductive layer and the fourth conductive layer (herein below referred to as a "third-layer/fourth-layer contact section") 86.

2) Bit-Bar Line

The bit-bar line 62 is formed in a manner to pass over the second bar-BL contact pad layer 72b, as shown in FIG. 11. The bit-bar line 62 is electrically connected to the second bar-BL contact pad layer 72b through the third-layer/fourth-layer contact section 86.

3) Vss Wiring

The Vss wiring 64 is formed in a manner to pass over the second Vss contact pad layer 74b, as shown in FIG. 11. The Vss wiring 64 is electrically connected to the second Vss contact pad layer 74b through the third-layer/fourth-layer contact section 86.

4) Cross-Sectional Structure of Fourth Conductive Layer

A cross-sectional structure of the fourth conductive layer will be described with reference to FIG. 12 and FIG. 13. The fourth conductive layer may have the same structure as the structure of the third conductive layer described above.

A cross-sectional structure of the third-layer/fourth-layer contact section 86 will be described. The third-layer/fourth-layer contact section 86 is formed in a manner to fill a through hole 94a that is formed in the third interlayer dielectric layer 94. The third-layer/fourth-layer contact section 86 may have the same structure as the structure of the field/second-layer contact section 80 described above.

Although not shown in FIG. 12 or FIG. 13, a passivation layer may be formed on the fourth conductive layer.

3. Effects

Effects provided by the semiconductor device in accordance with the present embodiment are described below.

(1) A first drain-gate wiring layer and a second drain-gate wiring layer could be formed in the same conductive layer. However, in this case, it is difficult to reduce the cell area due to the high pattern density of the conductive layer where the first and second drain-gate wiring layers are formed.

However, in accordance with the present embodiment, the first drain-gate wiring layer 30 is located in the first conductive layer. Also, the second drain-gate wiring layer has a structure that is divided into the lower layer 32a of the second drain-gate wiring layer and the upper layer 32b of the second drain-gate wiring layer. The lower layer 32a of the second drain-gate wiring layer is located in the second conductive layer, and the upper layer 32b of the second drain-gate wiring layer is located in the third conductive layer. Consequently, the first drain-gate wiring layer and the second drain-gate wiring layer are formed in different layers, respectively. Accordingly, since the first drain-gate wiring layer and the second drain-gate wiring layer are not formed in the same layer, the pattern density of the wiring layer can be reduced. As a result, by the memory cell in accordance with the present embodiment, the cell area can be reduced.

(2) The shorter the gate length, the larger the leak current becomes due to the short channel effect. However, the width W1 of the first gate—gate electrode layer 20 in the first load transistor Q5 is set to be larger than the width W2 of the first gate—gate electrode layer 20 in the first driver transistor Q3. In other words, the gate length of the first load transistor Q5 is larger than the gate length of the first driver transistor Q3. Accordingly, leak current in the first load transistor Q5 (in particular, leak current during a standby period) can be decreased, compared to the case in which the width W1 in the first load transistor Q5 is the same as or smaller than the width W2 in the first driver transistor Q3.

It is noted that a longer gate length makes the current more difficult to flow, such that the current performance of the transistor is lowered accordingly. However, the load transistor is accepted as long as a certain amount of current flows therein. For this reason, as long as a certain amount of current flows, the memory cell characteristic is not adversely affected even when the current performance of the load transistor lowers.

(3) Also, the width W3 of the second gate—gate electrode layer 22 in the second load transistor Q6 is set to be larger than the width W4 of the second gate—gate electrode layer 22 in the second driver transistor Q4. As a result, leak current at the second load transistor Q6 can be decreased.

(4) When the contact section 80 is provided in a region other than the area between the gate—gate electrode layer 20 in one memory cell MC and the gate—gate electrode layer 22 in another adjacent memory cell MC, the following effects are obtained.

Figure 17:
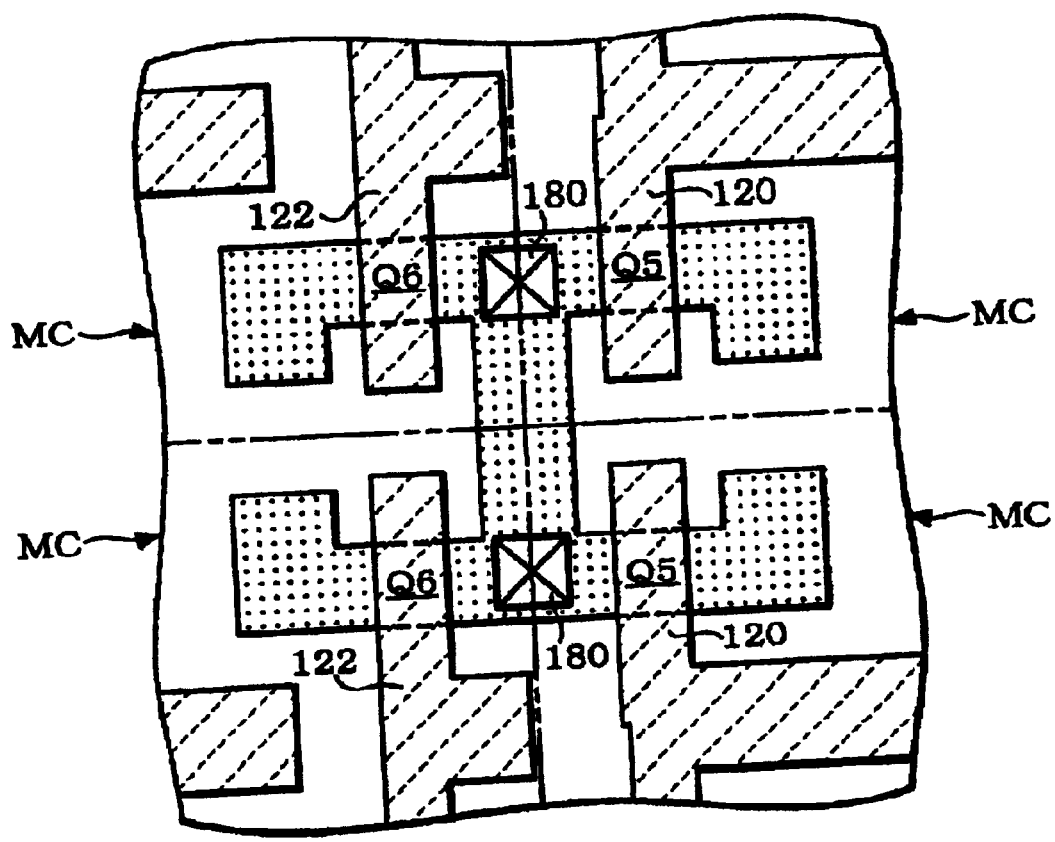
FIG. 17 schematically shows a plan view of a plane of a semiconductor device of an example for comparison.

As an example for comparison, as shown in FIG. 17, a contact section 180 may be provided between a gate—gate electrode layer 120 in one memory cell MC and a gate—gate electrode layer 122 in another memory cell adjacent to that memory cell. When the contact section 180 is provided between the gate—gate electrode layers 120 and 122, short circuit would likely occur between them because it is difficult to secure room between the gate—gate electrode layers 120 and 122 and the contact section 180.

However, in accordance with the present embodiment, the contact section 80 is provided in a region other than the area between the gate—gate electrode layer 20 in one memory cell MC and the gate—gate electrode layer 22 in another adjacent memory cell MC. For this reason, a sufficient space can be provided between the gate—gate electrode layers 20 and 22 and the contact section 80. AS a result, the gate—gate electrode layers 20 and 22 and the contact section 80 are prevented from being short-circuited.

4. Example of Application of SRAM to Electronic Apparatus

Figure 14:
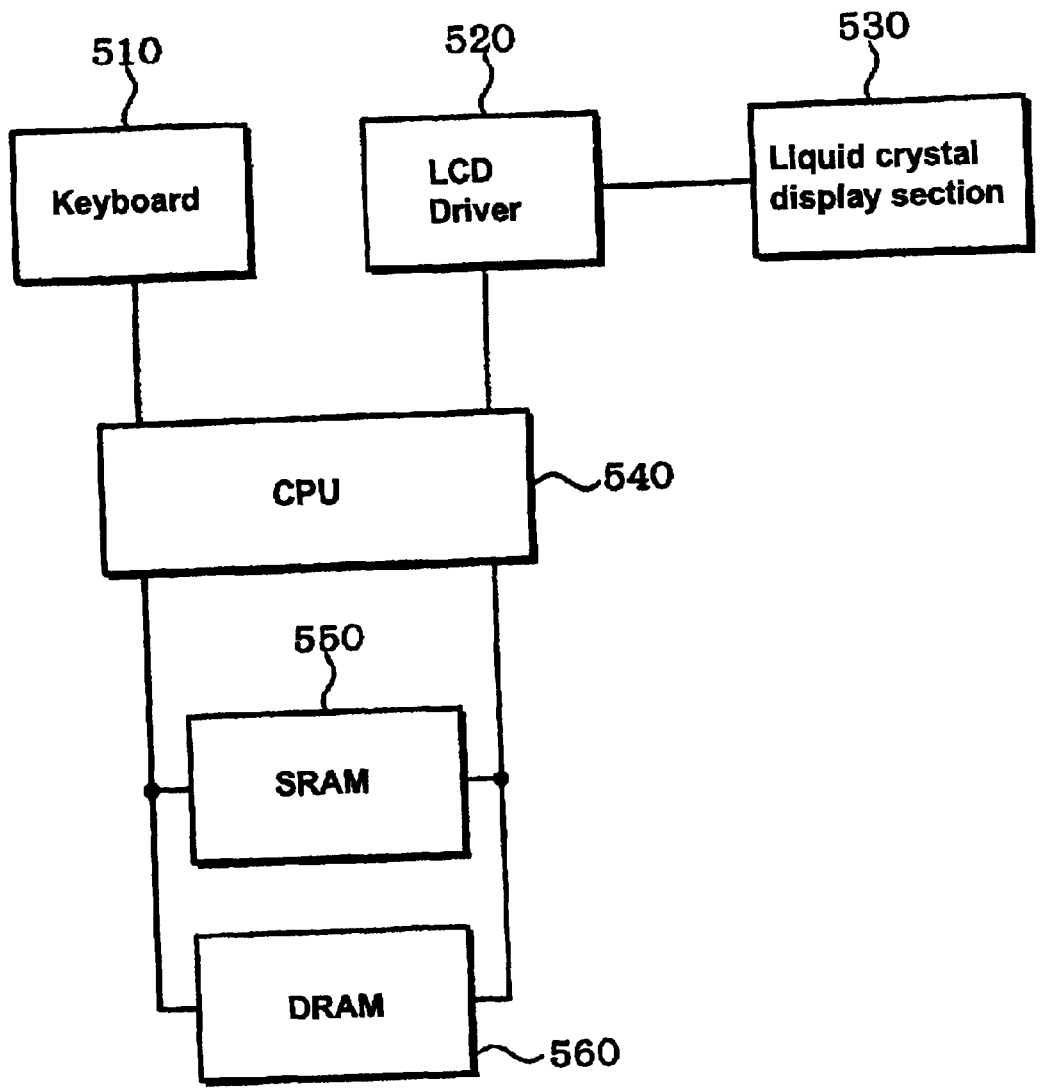
FIG. 14 shows a block diagram of a part of a mobile telephone system provided with the SRAM in accordance with the present embodiment.

The SRAM in accordance with the present embodiment may be applied to electronic apparatus, such as, for example, mobile equipment. FIG. 14 shows a block diagram of a part of a mobile telephone system. A CPU 540, an SRAM 550 and a DRAM 560 are mutually connected via a bus line. Further, the CPU 540 is connected to a keyboard 510 and an LCD driver 520 via the bus line. The LCD driver 520 is connected to a liquid crystal display section 530 via the bus line. The CPU 540, the SRAM 550 and the DRAM 560 compose a memory system.

Figure 15:
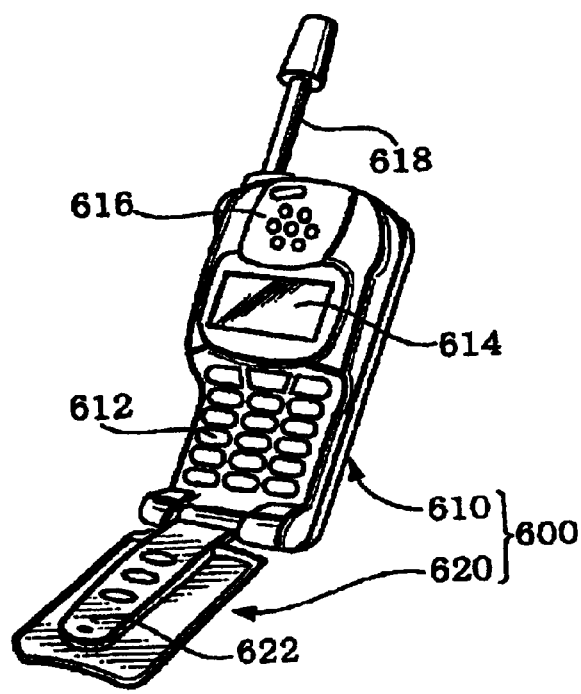
FIG. 15 shows a perspective view of a mobile telephone that is provided with the mobile telephone system shown in FIG. 14.

FIG. 15 shows a perspective view of a mobile telephone 600 that is provided with the mobile telephone system shown in FIG. 14. The mobile telephone 600 is provided with a main body section 610 including a keyboard 612, a liquid crystal display section 614, a receiver section 616 and an antenna section 618, and a lid section 620 including a transmitter section 622.

The present invention is not limited to the embodiment described above, and a variety of modifications can be made within the scope of the subject matter of the present invention.

It is noted that, in the embodiment described above, the load transistor and the driver transistor on the left side are defined as the first load transistor and the first driver transistor, respectively. However, the load transistor and the driver transistor on the right side may be defined as the first load transistor and the first driver transistor, respectively.

What is claimed is:

1. A semiconductor device comprising:
    a first gate—gate electrode layer inducting a gate electrode of a first load transistor and a gate electrode of a first driver transistor;
    a second gate—gate electrode layer including a gate electrode of a second load transistor and a gate electrode of a second driver transistor;
    a first drain—drain wiring layer which forms a part of a connection layer that electrically connects a drain region of the first load transistor and a drain region of the first driver transistor;
    a second drain—drain wiring layer which forms a part of a connection layer that electrically connects a drain region of the second load transistor and a drain region of the second driver transistor;
    a first drain-gate wiring layer which forms a part of a connection layer that electrically connects the first gate—gate electrode layer and the second drain—drain wiring layer; and
    a second drain-gate wiring layer which forms a part of a connection layer that electrically connects the second gate—gate electrode layer and the first drain—drain wiring layer,
    wherein the first drain-gate wiring layer and the second drain-gate wiring layer are located in different layers, respectively, and
    wherein a width of the first gate—gate electrode layer in the first load transistor is larger than the width of the first gate—gate electrode layer in the first driver transistor.

2. The semiconductor device according to claim 1, wherein a width of the second gate—gate electrode layer in the second load transistor is larger than the width of the second gate—gate electrode layer in the second driver transistor.

3. The semiconductor device according to claim 1, comprising a first adjacent memory cell which is located adjacent to a side of the memory cell where the first gate—gate electrode layer is provided,
    wherein the first adjacent memory cell includes a third gate—gate electrode layer having a gate electrode of a third load transistor and a gate electrode of a third driver transistor,
    wherein the first load transistor and the third load transistor commonly use a first impurity layer as a source region,
    wherein a first contact section is provided on the first impurity layer, and
    wherein the first contact section is provided in a region other than a region between the first gate—gate electrode layer and the third gate—gate electrode layer.

4. The semiconductor device according to claim 1, comprising a second adjacent memory cell which is located adjacent to a side of the memory cell where the second gate—gate electrode layer is provided,
    wherein the second adjacent memory cell includes a fourth gate—gate electrode layer having a gate electrode of a fourth load transistor and a gate electrode of a fourth driver transistor,
    wherein the second load transistor and the fourth load transistor commonly use a second impurity layer as a source region,
    wherein a second contact section is provided on the second impurity layer, and
    wherein the second contact section is provided in a region other than a region between the second gate—gate electrode layer and the fourth gate—gate electrode.

5. The semiconductor device according to claim 1,
    wherein the first drain-gate wiring layer is electrically connected to the second drain—drain wiring layer through a contact section, and wherein the second drain-gate wiring layer is electrically connected to the second gate—gate electrode layer through a contact section, and electrically connected to the first drain—drain wiring layer through a contact section.

6. The semiconductor device according to claim 1, wherein the first drain-gate wiring layer is located in a layer lower than the second drain-gate wiring layer.

7. The semiconductor device according to claim 1, wherein the first drain-gate wiring layer is located in a layer in which the first gate—gate electrode layer is provided.

8. The semiconductor device according to claim 1, wherein the second drain-gate wiring layer is formed across a plurality of layers.

9. The semiconductor device according to claim 8,
wherein the second drain-gate wiring layer includes a lower layer of the second drain-gate wiring layer and an upper layer of the second drain-gate wiring layer, and
wherein the upper layer is located in a layer over the lower layer, and electrically connected to the lower layer.

10. The semiconductor device according to claim 9, wherein the upper layer is electrically connected to the lower layer through a contact section.

11. The semiconductor device according to claim 9,
wherein the first gate—gate electrode layer, the second gate—gate electrode layer and the first drain-gate wiring layer are located in a first conductive layer,
wherein the first drain—drain wiring layer, the second drain—drain wiring layer and the lower layer are located in a second conductive layer, and
wherein the upper layer is located in a third conductive layer.

12. The semiconductor device according to claim 1, wherein the second conductive layer is a nitride layer of a refractory metal.

13. The semiconductor device according to claim 1, wherein the second conductive layer has a thickness of 100 nm to 200 nm.

14. A memory system provided with the semiconductor device defined in claim 1.

15. An electronic apparatus provided with the semiconductor device defined in claim 1.

* * * * *